US007368342B2

(12) United States Patent
Sonoda et al.

(10) Patent No.: US 7,368,342 B2
(45) Date of Patent: May 6, 2008

(54) SEMICONDUCTOR DEVICE AND METHOD OF MANUFACTURING THE SAME

(75) Inventors: Masahisa Sonoda, Mie (JP); Hiroaki Tsunoda, Mie (JP); Eiji Sakagami, Mie (JP); Hidemi Kanetaka, Mie (JP); Kenji Matsuzaki, Mie (JP); Takanori Matsumoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 10/948,661

(22) Filed: Sep. 24, 2004

(65) Prior Publication Data
US 2005/0040439 A1 Feb. 24, 2005

Related U.S. Application Data

(62) Division of application No. 10/254,680, filed on Sep. 26, 2002, now abandoned.

(30) Foreign Application Priority Data
Sep. 27, 2001 (JP) .............................. 2001-296391

(51) Int. Cl.
*H01L 21/336* (2006.01)
*H01L 21/8238* (2006.01)
(52) U.S. Cl. ...................... 438/217; 438/270; 438/233; 438/199
(58) Field of Classification Search ................ 438/207, 438/218–219, 221, 225, 294, 427, 217, 270–271, 438/233, 926, 183, 276, 775, 199, 585, 275
See application file for complete search history.

(56) References Cited

U.S. PATENT DOCUMENTS

| 4,985,368 A | | 1/1991 | Ishii et al. | |
|---|---|---|---|---|
| 5,939,765 A | * | 8/1999 | Zheng et al. | 257/510 |
| 6,081,662 A | | 6/2000 | Murakami et al. | |
| 6,107,158 A | * | 8/2000 | Zheng et al. | 438/424 |
| 6,140,206 A | | 10/2000 | Li et al. | |
| 6,165,854 A | | 12/2000 | Wu | |
| 6,207,534 B1 | * | 3/2001 | Chan et al. | 438/427 |
| 6,277,710 B1 | * | 8/2001 | Kim et al. | 438/431 |
| 6,468,926 B1 | * | 10/2002 | Irino et al. | 438/773 |
| 6,482,701 B1 | | 11/2002 | Ishikawa et al. | |
| 6,596,608 B2 | * | 7/2003 | Saito | 438/424 |
| 6,600,189 B1 | * | 7/2003 | Sato et al. | 257/301 |
| 6,720,235 B2 | * | 4/2004 | Ku et al. | 438/435 |

FOREIGN PATENT DOCUMENTS

| JP | 09-162168 | 6/1997 |
|---|---|---|
| JP | 2000-299374 | 10/2000 |
| JP | 2000-311938 | 11/2000 |

* cited by examiner

Primary Examiner—Chuong A. Luu
(74) Attorney, Agent, or Firm—Finnegan, Henderson, Farabow, Garrett & Dunner, L.L.P.

(57) ABSTRACT

A method for manufacturing a semiconductor device includes forming a gate-insulating film on a semiconductor substrate; forming a gate electrode on the gate-insulating film to be electrically insulated from the semiconductor substrate; etching the gate electrode, the gate insulating film and the semiconductor substrate to form a trench which is used to electrically isolate a device region for forming a device from the remainder region on the substrate top surface; and etching the inside of the trench using a gas containing $Cl_2$ and HBr with a different condition from the etching condition of the semiconductor substrate.

10 Claims, 4 Drawing Sheets

SEMICONDUCTOR DEVICE AND METHOD OF MANUFACTURING THE SAME

CROSS-REFERENCE TO RELATED APPLICATION

This application is a division of application Ser. No. 10/254,680, filed Sep. 26, 2002 now abandoned, which is incorporated herein in its entirety by reference. This application is also based upon and claims priority from prior Japanese Patent Application No. 2001-296391, filed on Sep. 27, 2001, the entire contents of which are incorporated herein by reference.

BACKGROUND OF THE INVENTION

1. Field of the Invention

This invention relates to a semiconductor device and method for manufacturing the semiconductor device, and more particularly to a semiconductor device having an isolation of an STI and its manufacturing method.

2. Related Background Art

For the purpose of downsizing semiconductor devices, the method of isolating elements by STI (Shallow Trench Isolation) has been used for years in lieu of the technique using selective oxidation for isolating elements. STI is a technique for electrically isolating device regions for forming devices from other regions in a semiconductor device by providing shallow trenches. In STI, trenches are formed in device isolating regions instead of using selective oxidation thereof.

FIG. 4 is an enlarged cross-sectional view of a semiconductor device 400 having conventional STI made by a process of its manufacturing. A gate-insulating film 20 is formed on a top surface of a semiconductor substrate 10. A gate electrode 30 of an amorphous silicon film overlies the gate-insulating film 20. A silicon nitride film 40 is deposited on the gate electrode 30. A silicon oxide film 50 is deposited on the silicon nitride film 40.

The silicon nitride film 40 and the silicon oxide film 50 are selectively etched off to obtain a predetermined pattern by using a photolithography technique. After that, using the silicon oxide film 50 as a mask, the gate electrode 30, the gate-insulating film 20 and the semiconductor substrate 10 are selectively removed by etching. By this etching, the trench 60 is formed to reach the semiconductor substrate 10.

Subsequently, the side and bottom surface portions of the trench 60 are oxidized by an RTO (rapid thermal oxidation) in an oxygen $O_2$ atmosphere heated to 1000° C. In FIG. 4, the trench 60 and its surrounding structure after the RTO treatment are shown in an enlarged scale.

On the side surface and the bottom surface of the trench 60, a silicon oxide film 70 is formed by the RTO. The silicon oxide film 70 protects the surface of the semiconductor substrate 10, etc. from the air.

When the trench 60 is oxidized in the oxygen $O_2$ atmosphere, the diffusion coefficient of an oxidation seed diffusing into silicon single crystal is smaller than that of an oxidation seed diffusing into amorphous silicon. Stresses rise in the periphery of the boundary portions (e.g. sides, edges and corners) between the side surface and the bottom surface of the trench 60 during the oxidation progress. The diffusion coefficient of an oxidation seed on the periphery of the boundary portions, where a relatively large stress rises, is smaller than that of an oxidation seed on the flat surface portions, where a relatively small stress rises. In general, a gas including fluorocarbon (e.g. $CF_4$, $C_3F_8$, and so on) is often used in RIE process.

Therefore, the boundary portions 80, which are provided at the bottom portion of the trench 60 of the semiconductor device 400, are more difficult to be oxidized than the flat surface portions inside the trench 60. Thus, the oxide film becomes thinner and thinner toward the boundary portions 80. Further, the oxide film provided on the boundary portions 80 is thinner than the oxide film provided on their flat surfaces. As a result, the boundary portions 80 are sharpened, and have curved surfaces, each of which has a small curvature radius.

The sharper the boundary portions 80 and the smaller the curvature radius of the curved surface in the boundary portions 80 becomes, as shown in FIG. 2A, the larger the stress becomes therein. The stress which rises in the boundary portions 80 includes not only the stress concentrated by the oxidation, but also includes the stress from an amorphous silicon, a silicon nitride film and a silicon oxide film which are deposited on the semiconductor substrate 10.

As shown in FIG. 2A, the stress concentration in the boundary portions 80 of the trench 60 easily causes crystal defects 91 in the boundary portions 80. The crystal defects 91 cause, e.g., a leakage of the carrier, therefore the crystal defects 91 interfere with the normal operations of the semiconductor devices. As a result, they cause a lower yield of the semiconductor devices.

SUMMARY OF THE INVENTION

According to an embodiment of the invention, there is provided a semiconductor device comprising: a semiconductor substrate having a substrate top surface on which a device is to be formed; a gate electrode formed on said substrate top surface and electrically insulated from the semiconductor substrate by a gate-insulating film; a trench formed through the gate electrode into the semiconductor substrate to electrically insulate a device region for forming a device from the remainder region of the substrate top surface; and a boundary portion which is defined between a side surface of the trench and a bottom surface of the trench; wherein said boundary portion has spherical shapes having a curvature radius not smaller than 80 nm.

According to a further embodiment of the invention, there is provided a semiconductor device comprising: a semiconductor substrate having a substrate top surface on which a device is to be formed; a gate electrode formed on said substrate top surface and electrically insulated from the semiconductor substrate by a gate-insulating film; a trench formed through the gate electrode into the semiconductor substrate to electrically isolate a device region for forming a device from the remainder region of the substrate top surface; and oxidation films formed on a side surface of the trench and a bottom surface of the trench, respectively; wherein the thickness of the oxidation film formed on the side surface is same as that of the oxidation film formed on the bottom surface.

According to an embodiment of the invention, there is provided a method for manufacturing a semiconductor device comprising: forming a gate-insulating film on a semiconductor substrate; forming a gate electrode on the gate-insulating film to be electrically insulated from the semiconductor substrate; etching the gate electrode, the gate insulting film and the semiconductor substrate to form a trench which is used to electrically isolate a device region for forming a device from the remainder region on the substrate top surface; further etching the inside of the trench using a gas containing $Cl_2$ or HBr.

DETAILED DESCRIPTION OF THE INVENTION

Embodiments of the invention will be explained below with reference to the drawings. The embodiments, however, should not be construed to limit the invention.

Figure 1A:
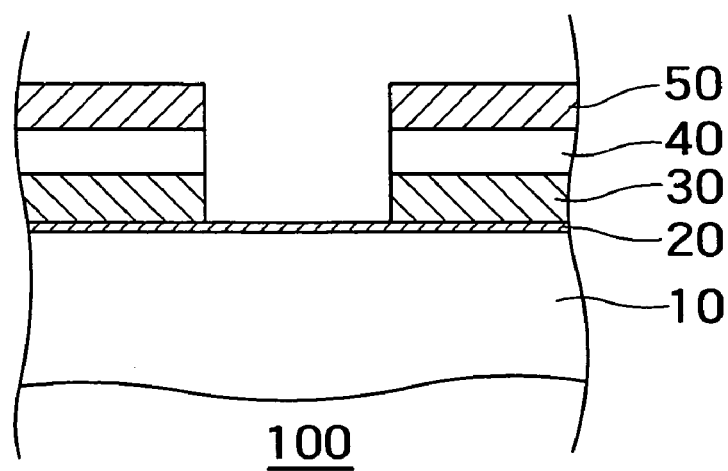
FIG. 1A is an enlarged cross-sectional view of a trench and its surrounding structure in a semiconductor device 100 having an STI under a process step of its manufacturing according to an embodiment of the invention.
Figure 1B:
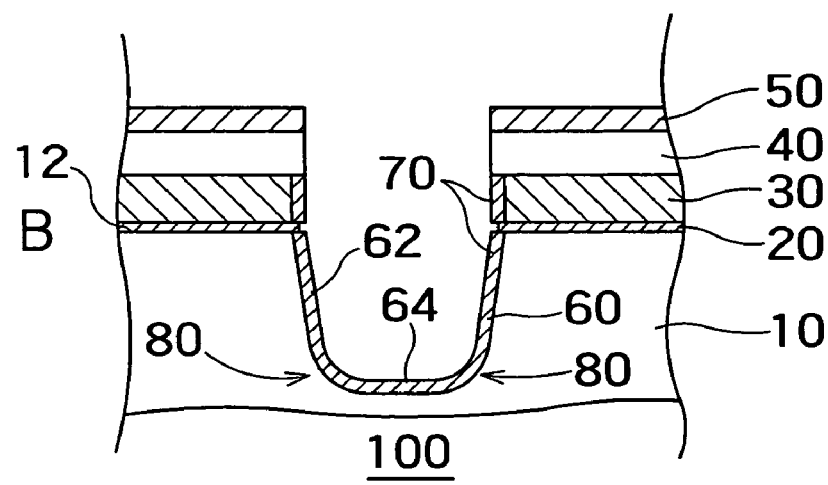
FIG. 1B is an enlarged cross-sectional view of the trench and its surrounding structure in the semiconductor device 100 next step of the manufacturing process of FIG. 1A.
Figure 1C:
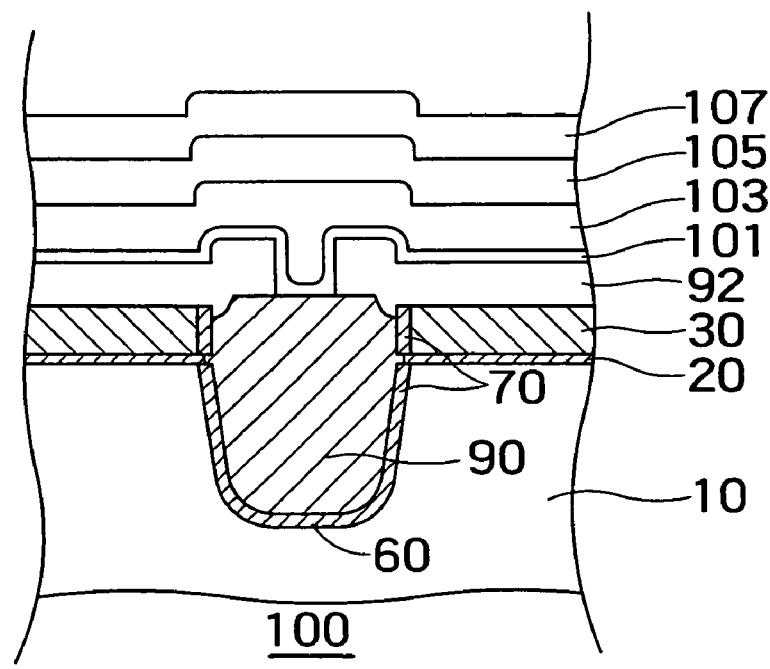
FIG. 1C is an enlarged cross-sectional view of the trench and its surrounding structure in the semiconductor device 100 next step of the manufacturing process of FIG. 1B.

FIGS. 1A, 1B and 1C are enlarged cross-sectional views of a trench and its surrounding structure in a semiconductor device 100 having STI according to an embodiment of the invention. The semiconductor device 100 is manufactured in the order of the steps shown in FIG. 1A, FIG. 1B and FIG. 1C.

First referring to FIG. 1A, a gate-insulating film 20 is provided on a substrate top surface 12 of a semiconductor substrate 10. A gate electrode 30 of the amorphous silicon is provided on the gate-insulating film 20. A silicon nitride film 40 is then deposited on the gate electrode 30. Further, a silicon oxide film 50 is deposited on the silicon nitride film 40.

The silicon oxide film 50, the silicon nitride film 40 and the gate electrode 30 are selectively etched into a predetermined pattern by using the photolithography technique.

Referring to FIG. 1B, then, using the silicon oxide film 50 as a mask, the gate-insulating film 20 and semiconductor substrate 10 are selectively removed by an etching. In this etching, a trench 60 is formed to penetrate the gate-insulating film 20 and reach the semiconductor substrate 10. When the semiconductor substrate 10 is etched to form the trench 60, an RIE process under a high-pressure atmosphere, in which an etching gas including $Cl_2$ and HBr is used, is added to the ordinary RIE process. These RIE processes using $Cl_2$ and HBr and the ordinary RIE process are implemented consecutively in the same chamber.

Subsequently, the side and bottom surface portions of the trench 60 are oxidized by RTO in oxygen $O_2$ atmosphere held at 1000° C. In FIG. 1B, the trench 60 and the surrounding structure of the trench 60 after RTO treatment are shown in an enlarged scale. This oxidation process may be implemented in a hydrogen $H_2$ and oxygen $O_2$ atmosphere or in ozone $O_3$ atmosphere in lieu of oxygen $O_2$ atmosphere. The curvature radius of the boundary portions 80 may be larger when the oxidation process is implemented in the hydrogen $H_2$ and oxygen $O_2$ atmosphere or in the ozone $O_3$ atmosphere than when it is implemented in the oxygen $O_2$ atmosphere.

In this way, the trench 60 is formed in the substrate surface of the semiconductor substrate 10. The trench 60 electrically isolates a device region for forming a device from the remainder region of the substrate top surface. The boundary portions 80 are defined as portions between the bottom surface of said trench 60 and the side surface of said trench 60. In the instant embodiment, the boundary portions 80 have a curvature radius not smaller than 80 nm. In addition, the side surface 62 and the bottom surface 64 of the trench 60 is substantially planer. Namely, the curvature radiuses of the side surface 62 and the bottom surface 64 is substantially infinitely large.

In the instant embodiments when the semiconductor substrate 10 is etched to form the trench 60, the RIE process using $Cl_2$ and HBr is further applied to the ordinary RIE process. However, even if the ordinary RIE process is implemented without adding the RIE process of $Cl_2$ and HBr, an oxidation process using hydrogen $H_2$ and oxygen $O_2$ atmosphere or an ozone $O_3$ atmosphere, after the ordinary etching step, can make the curvature radius of the boundary portions 80 large.

Namely, When the RIE process using $Cl_2$ and HBr is added to the ordinary RIE process, the curvature radius of the boundary portions 80 can be large. And when the oxidation process is implemented in the hydrogen $H_2$ and oxygen $O_2$ atmosphere after the ordinary etching step, the curvature radius of the boundary portions 80 can also be large. Furthermore, when the oxidation process is implemented in the ozone $O_3$ atmosphere after the ordinary etching step, the curvature radius of the boundary portions 80 can also be large. Any one of these processes may be used. Of course, the RIE process using $Cl_2$ and HBr and anyone of the oxidation processes using the $Cl_2$ and HBr atmosphere or using the ozone $O_3$ atmosphere may be combined.

Any other methods, by which the boundary portions 80 can be formed in spherical shapes having a large curvature radius, may be used in the instant embodiment.

After that, as shown in FIG. 1C, a silicon oxide material 90 is deposited to fill the trench 60 by using the HDP (High Density Plasma) technique. Then the silicon oxide material 90 is planarized by CMP, and the semiconductor substrate 10 is thereafter heated at approximately 900° C. in a nitrogen atmosphere. After the semiconductor substrate 10 is next exposed to $NH_4F$ solution, the silicon nitride film 40 is removed by phosphation at approximately 150° C. Thereafter, doped polysilicon 92 containing phosphor is deposited on the silicon oxide material 90 and the gate electrode 30 by low-pressure CVD. Then, an ONO film (a three-component film consisting of an oxide film, a nitride film and a oxide film) 101, an amorphous silicon film 103 containing phosphor, WSi film 105 and a silicon oxide film 107 are deposited using LP-CVD (Low-Pressure Chemical Vapor Deposition).

The silicon oxide film 107 is selectively removed by RIE etching into a predetermined pattern by photolithography. Using the silicon oxide film 107 as a mask, the ONO film 101, the amorphous silicon film 103 and the WSi film 105 are selectively removed by RIE etching.

Through some further steps, the semiconductor device 100 having isolations of the trench 60 is completed.

Figure 2B:
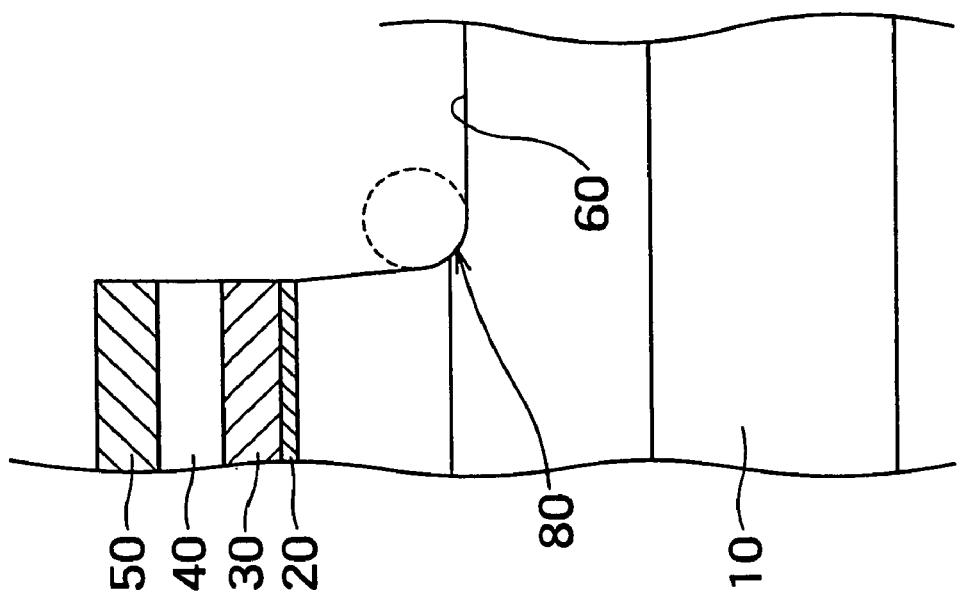
FIG. 2B is an enlarged cross-sectional view of the boundary portion 80 shown in FIG. 1B.
Figure 2A:
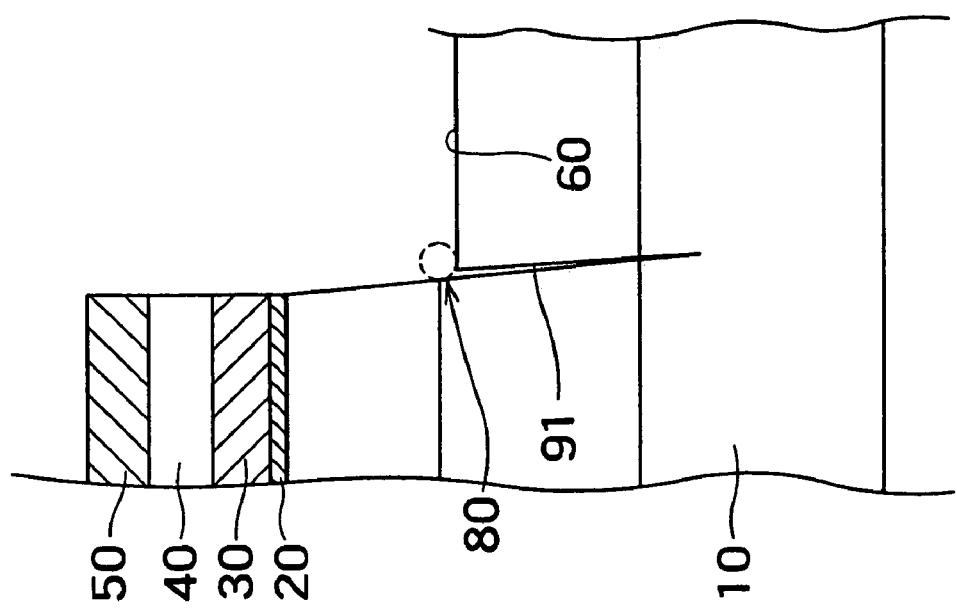
FIG. 2A is an enlarged cross-sectional view of the boundary portion 80 shown in FIG. 4.
Figure 4:
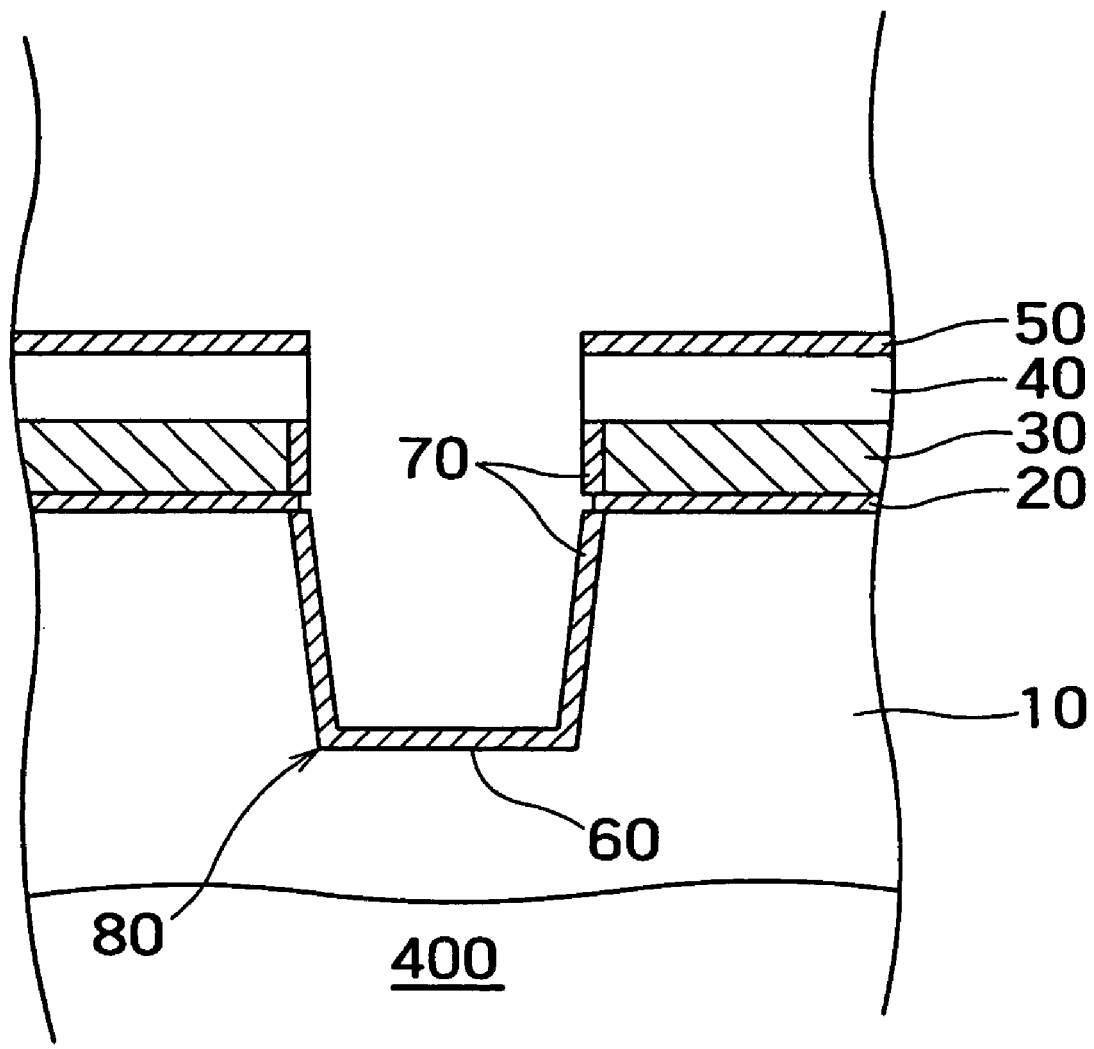
FIG. 4 is an enlarged cross-sectional view of a trench and its surrounding structure in a conventional semiconductor device 400 having the STI.

FIGS. 2A and 2B show an enlarged cross-sectional view of the boundary portions 80 shown in FIG. 4 and the boundary portions 80 shown in FIG. 1B, respectively. The cross-sectional views in FIGS. 2A and 2B show the states of the boundary portions 80 in which the silicon oxide films 70 are removed.

In the conventional semiconductor device 400, the sharper the boundary portions 80 or the smaller the curvature radius of the boundary portions 80 becomes, as shown in FIG. 2A, the larger the stress thereto. The stress concentration in the boundary portions 80 of the trench 60 causes crystal defects 91 in the boundary portions 80 easily. The crystal defects 91 adversely affect the normal operations of the semiconductor device 400, and cause trouble in the semiconductor devices 400. For example, if the crystal defects 91 in the boundary portions 80 go through a well portion, then carriers leak from the well portion. Thus, a leakage occurs at the standby state in the semiconductor device 400.

Meanwhile, since the curvature radius of the boundary portions 80 in the semiconductor device 100 in accordance with the instance embodiment is large, as shown in FIG. 2B, a stress does not easily concentrate in the boundary portions 80. Since the stress is hardly concentrated in the boundary portions 80, crystal defects 91 hardly occur in the boundary portions 80. Therefore, the semiconductor device 100 can function well, and the semiconductor device 100 hardly breaks down. In the instant embodiment, the curvature radius of the boundary portions 80 is not smaller than approximately 80 nm. In order that the curvature radius of the boundary portions 80 is easily understood, the radii are illustrated by broken line circles in FIG. 2A and FIG. 2B.

Figure 3:
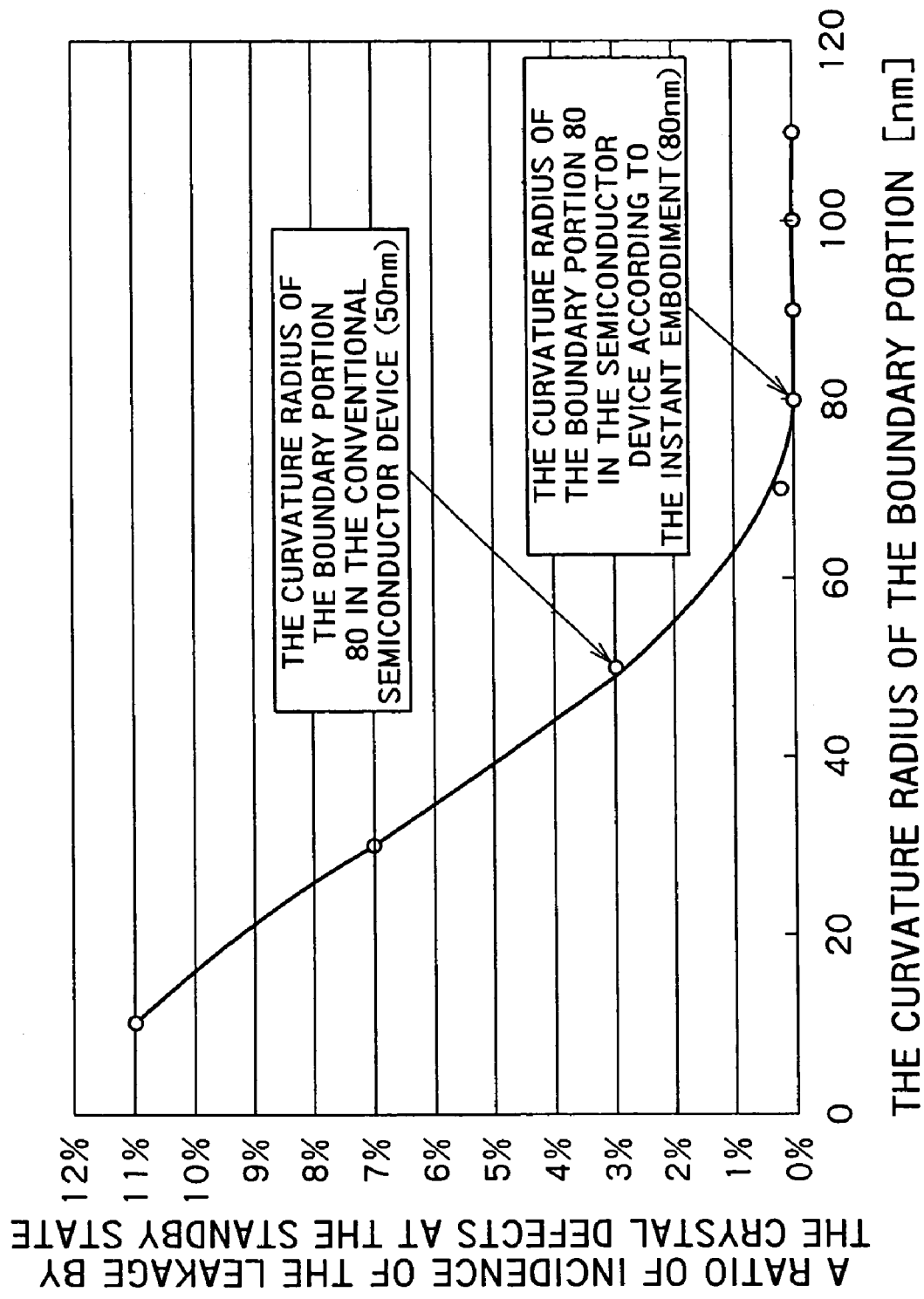
FIG. 3 is a diagram showing a graph that illustrates a relation between the curvature radius of the boundary portion 80 and a ratio of incidence of the leakage by the crystal defects at the standby state in the semiconductor device.

FIG. 3 is a graph showing the relation between the curvature radius of the boundary portions 80 and the ratio of the leakage caused by crystal defects at the standby state of the semiconductor device. The curvature radius of the boundary portions 80 in the conventional semiconductor device 400 is smaller than approximately 50 nm. When the curvature radius of the boundary portions 80 is smaller than 50 nm, as shown in FIG. 3, the ratio of the leakage becomes more than approximately 3%.

Meanwhile, the curvature radius of the boundary portions 80 in the semiconductor device 100 according to the instant embodiment is larger than approximately 80 nm. When the curvature radius of the boundary portions 80 is larger than 80 nm, as shown in FIG. 3, the ratio of the leakage becomes approximately 0%.

Namely, the graph in FIG. 3 indicates that when the curvature radius of the boundary portions 80 at the bottom of the trench 60 becomes large, the ratio of the leakage decreases.

Since the curvature radius of the boundary portions 80 of the semiconductor device 100 according to the instant embodiment is larger than that of the conventional semiconductor device 400, the stress does not rise easier on the boundary portions 80 of the semiconductor device 100 than on that of the conventional semiconductor device 400. Therefore, crystal defects 91 hardly occur in the boundary portions 80 of the semiconductor device 100. The normal operations of the semiconductor device 100 are not interfered with. For example, the crystal defects 91 do not arise at the boundary portions 80, so that carriers do not leak from the well portion. Thus, a leakage occurs at the standby state in the semiconductor device 100.

According to the instant embodiment, a stress does not concentrate on the periphery of the boundary portions (e.g. sides, edges and corners) between the surfaces of the trench used for STI. Therefore, crystal defects do not occur in the boundary portions, and failures do not arise in the device.

What is claimed is:

1. A method for manufacturing a semiconductor device comprising:
    forming a gate-insulating film on a semiconductor substrate;
    forming a gate electrode on said gate-insulating film to be electrically insulated from said semiconductor substrate;
    etching said gate electrode, said gate insulating film, and said semiconductor substrate to form a trench, said trench being used to electrically isolate a device region for forming a device from a remainder region on a top surface of the substrate; and
    etching an inside surface including a bottom surface of said trench using a gas containing $cl_2$ and HBr, with a different condition from the etching condition of the semiconductor substrate, wherein
    an atmospheric pressure at the trench inside etching is higher than an atmospheric pressure of the atmosphere at the semiconductor substrate etching.

2. The method according to claim 1, further comprising oxidizing the inside of said trench in a hydrogen $H_2$ and oxygen $O_2$ atmosphere, after the step of etching the inside of said trench.

3. The method according to claim 1, further comprising oxidizing the inside of said trench in an ozone $O_3$ atmosphere, after the step of etching the inside of said trench.

4. The method according to claim 2, further comprising:
    filling an insulator inside said trench to electrically isolate said device region from the remainder region.

5. The method according to claim 3, further comprising:
    filling an insulator inside said trench to electrically isolate said device region from the remainder region.

6. A method for manufacturing a semiconductor device having a substrate, comprising:
    forming a gate-insulating film on the substrate;
    forming a gate electrode material on the gate-insulating film;
    etching the gate electrode material into a predetermined pattern to form a gate electrode;
    etching the gate-insulating film exposed by the etching of the gate electrode material;
    performing a first etching of the substrate exposed by the etching of the gate-insulating film, under a first atmospheric pressure; and
    performing a second etching of the substrate, following the first etching of the substrate, using a gas containing $Cl_2$ and HBr under a second atmospheric pressure being higher than the first atmospheric pressure.

7. The method according to claim 6, further comprising:
    oxidizing an inside of the trench in a hydrogen ($H_2$) and oxygen ($O_2$) atmosphere after the second etching of the substrate.

8. The method according to claim 6, further comprising:
    oxidizing an inside of the trench in an ozone ($O_3$) atmosphere after the second etching of the substrate.

9. A method for manufacturing a semiconductor device having a substrate, comprising:
    forming a gate-insulting film on the substrate;
    forming a gate electrode material on the gate-insulating film;
    etching the gate electrode material into a predetermined pattern to form a gate electrode;
    etching the gate-insulating film exposed by the etching of the gate electrode material;
    etching the substrate exposed by the etching of the gate-insulating film under a first atmospheric pressure; and
    changing an etching condition of the substrate from the first atmospheric pressure to a second atmospheric pressure higher than the first atmospheric pressure.

10. The method according to claim 9, wherein a gas containing $Cl_2$ and HBr is used in the etching of the substrate.

* * * * *

UNITED STATES PATENT AND TRADEMARK OFFICE
CERTIFICATE OF CORRECTION

| | |
|---|---|
| PATENT NO. | : 7,368,342 B2 |
| APPLICATION NO. | : 10/948661 |
| DATED | : May 6, 2008 |
| INVENTOR(S) | : Sonoda et al. |

Page 1 of 1

It is certified that error appears in the above-identified patent and that said Letters Patent is hereby corrected as shown below:

Claim 1, column 6, line 5, change "$cl_2$" to --$Cl_2$--.

Signed and Sealed this

Twelfth Day of August, 2008

*JON W. DUDAS*
*Director of the United States Patent and Trademark Office*